(12) United States Patent
Kang et al.

(10) Patent No.: US 7,777,213 B2
(45) Date of Patent: Aug. 17, 2010

(54) PHASE CHANGE LAYER INCLUDING INDIUM AND METHOD OF MANUFACTURING THE SAME AND PHASE CHANGE MEMORY DEVICE COMPRISING PHASE CHANGE LAYER INCLUDING INDIUM AND METHODS OF MANUFACTURING AND OPERATING THE SAME

(75) Inventors: Youn-seon Kang, Seoul (KR); Jin-seo Noh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 158 days.

(21) Appl. No.: 12/000,379

(22) Filed: Dec. 12, 2007

(65) Prior Publication Data

US 2008/0175042 A1 Jul. 24, 2008

(30) Foreign Application Priority Data

Jan. 18, 2007 (KR) .................. 10-2007-0005816

(51) Int. Cl.
*H01L 29/02* (2006.01)
(52) U.S. Cl. .................. 257/2; 257/E29.02; 438/102; 365/163
(58) Field of Classification Search .......... 257/1–5, 257/E29.002; 438/102–103; 365/163
See application file for complete search history.

(56) References Cited

U.S. PATENT DOCUMENTS

| 5,254,382 | A  | * | 10/1993 | Ueno et al. .................. 428/64.5 |
| 2002/0018870 | A1 | * | 2/2002 | Meinders et al. ............. 428/64.4 |
| 2004/0124407 | A1 | * | 7/2004 | Kozicki et al. ................. 257/9 |
| 2004/0166439 | A1 | * | 8/2004 | Ohkubo .................. 430/270.13 |
| 2006/0049389 | A1 | * | 3/2006 | Lankhorst et al. ............. 257/2 |
| 2007/0170881 | A1 | * | 7/2007 | Noh et al. .................... 318/453 |
| 2008/0023686 | A1 | * | 1/2008 | Noh et al. ....................... 257/4 |

* cited by examiner

*Primary Examiner*—Bradley K Smith
*Assistant Examiner*—Jami M Valentine
(74) *Attorney, Agent, or Firm*—Harness, Dickey & Pierce, P.L.C.

(57) ABSTRACT

Provided are a phase change layer and a method of forming the phase change layer and a phase change memory device including the phase change layer, and methods of manufacturing and operating the phase change memory device. The phase change layer may be formed of a quaternary compound including an amount of indium (In) ranging from about 15 at. % to about 20 at. %. The phase change layer may be $In_aGe_bSb_cTe_d$, wherein an amount of germanium (Ge) ranges from about 10 at. %≦b≦about 15 at. %, an amount of antimony (Sb) ranges from about 20 at. %≦c≦about 25 at. %, and an amount of tellurium (Te) ranges from about 40 at. %≦d≦about 55 at. %.

5 Claims, 11 Drawing Sheets

PHASE CHANGE LAYER INCLUDING INDIUM AND METHOD OF MANUFACTURING THE SAME AND PHASE CHANGE MEMORY DEVICE COMPRISING PHASE CHANGE LAYER INCLUDING INDIUM AND METHODS OF MANUFACTURING AND OPERATING THE SAME

PRIORITY STATEMENT

This application claims priority under 35 U.S.C. §119 to Korean Patent Application No. 10-2007-0005816, filed on Jan. 18, 2007, in the Korean Intellectual Property Office (KIPO), the entire contents of which are incorporated herein by reference.

BACKGROUND

1. Field

Example embodiments relate to a semiconductor memory device. Other example embodiments relate to a phase change layer and method of manufacturing the same, and a phase change memory device having the phase change material and methods of manufacturing and operating the phase change memory device.

2. Description of the Related Art

Phase change random access memories (PRAMS) are one type of phase change memory devices, which are next-generation nonvolatile memory devices. The PRAMs may include a storage node comprising a phase change layer. The phase change layer may switch from amorphous to crystalline states and revert back to the amorphous state, or switch from crystalline to amorphous states and revert back to the crystalline state. The phase change layer in a crystalline state may have lower resistance than when in an amorphous state. PRAMs may record data based on the principle that the resistance of the phase change layer varies depending on the phase of the phase change layer.

A first temperature (melting point) at which the phase change layer changes from crystalline to amorphous states may be higher than a second temperature (crystallization point) at which the phase change layer changes from amorphous to crystalline states. As electric current flows through the phase change layer during operation of a PRAM, Joule heat may be generated, which causes heating of the phase change layer to the first temperature or the second temperature. When the first temperature is reached by causing a first current to flow through the phase change layer during a PRAM operation, the first current may be referred to as a 'reset current'. When the second temperature is reached by causing a second current to flow through the phase change layer, the second current may be referred to as a 'set current'. Current may flow into the phase change layer through a switching device during the PRAM operation to generate Joule heat, and thus, the magnitude of current flowing into the phase change layer during the PRAM operation may not be greater than that of current that the switching device may support.

Like in other memory devices, increasing integration density may be important in PRAM development. One method of increasing integration density of a PRAM is to reduce the size of the switching device. However, as the size of the switching device, e.g., a transistor, is reduced, the magnitude of current that the switching device may support decreases, which means that a maximum current that may flow through the phase change layer decreases. Thus, the reset current flowing through the phase change layer may be low enough to increase the integration density of the PRAM.

A $Ge_2Sb_2Te_5$ (GST) layer may be used as the phase change layer. The GST layer may have a relatively high melting point of about 620° C. and a relatively high reset current may be required to increase the temperature of the GST layer to about 620° C. Thus, when the size of the switching device is reduced in a current of the PRAM using the GST layer as the phase change layer (hereinafter called a 'conventional PRAM'), the switching device may not permit the reset current required to increase the temperature of the GST layer to about 620° C. For example, the conventional PRAM may not actually achieve increased integration density without replacing the GST layer.

Another drawback of the conventional PRAM is that cell disturbance may occur between two adjacent cells because the GST layer in the conventional PRAM has a relatively high melting point of about 620° C., however, a relatively low crystallization point of about 160° C. The cell disturbance may refer to a phenomenon by which a cell, which is adjacent to a selected cell that is being accessed, is disturbed. The conventional PRAM may also exhibit undesirable data retention and/or IR reflow characteristics.

SUMMARY

Example embodiments provide a phase change layer that is thermally and structurally stable with a crystallization point Tc higher than that of a $Ge_2Sb_2Te_5$ (GST) layer, and a melting point Tm lower than that of the GST layer. Example embodiments provide a method of forming the phase change layer. Example embodiments also provide a phase change memory device including the phase change layer. Example embodiments also provide a method of manufacturing the phase change memory device. Example embodiments also provide a method of operating the phase change memory device.

According to example embodiments, a phase change layer may include a quaternary compound including an amount a of indium (In) in a range of about 15 at. % $\leq$ a $\leq$ about 20 at. %. The phase change layer may be $In_aGe_bSb_cTe_d$ ("IGST") wherein the amount b of germanium (Ge) may be in a range of about 10 at. % $\leq$ b $\leq$ about 15 at. %, the amount c of antimony (Sb) may be in a range of about 20 at. % $\leq$ c $\leq$ about 25 at. %, and the amount d of tellurium (Te) may be in a range of about 40 at. % $\leq$ d $\leq$ about 55 at. %.

According to example embodiments, a method of forming a phase change layer may include preparing a co-sputtering target including first and second targets within a reaction chamber that is used for sputtering deposition of the phase change layer, loading a substrate on which the phase change layer will be formed into the reaction chamber, and applying first and second radio frequency (RF) power to the first and second targets, respectively.

For example, the first target may be a Ge—Sb—Te based target, e.g., a $Ge_2Sb_2Te_5$ target. The second target may be one of an In—Sb—Te based target, an In—Sb based target, an In—Te based target, and an In target. If the second target is an In—Sb—Te based target, the second target may be an $In_3Sb_1Te_2$ target. In applying the first and second RF power to the first and second targets, the first RF power level may be different from the second RF power level.

According to example embodiments, a phase change memory device may include a storage node having a phase change layer and a switching element connected to the storage node, wherein the storage node includes the aforementioned phase change layer. According to example embodiments, a method of manufacturing a phase change memory device may include forming a storage node including a phase change layer on an underlying substrate structure including a switching element, and connecting the switching element to the storage node, wherein the phase change layer is formed using the method of example embodiments.

The first and second targets may be formed of substantially the same material as described above. In applying the first and second RF power, the first RF power level may be different from the second RF power level. The phase change layer may be an IGST layer with an amount a of indium (In) in a range of about 15 at. %≦a≦about 20 at. %. The IGST layer may also include an amount b of germanium (Ge) in a range of about 10 at. %≦b≦about 15 at. %, an amount c of antimony (Sb) in a range of about 20 at. %≦c≦about 25 at. %, and an amount d of tellurium (Te) in a range of about 40 at. %≦d≦about 55 at. %.

According to example embodiments, a method of operating a phase change memory device may include maintaining a switching element in an on-state; and applying an operating voltage to a storage node including a phase change layer and connected to the switching element, wherein the phase change layer is formed of a quaternary compound including an amount a of indium (In) in a range of about 15 at. %≦a≦about 20 at. %. The quaternary compound may be $In_aGe_bSb_cTe_d$ (IGST), and wherein an amount b of germanium (Ge) is in a range of about 10 at. %≦b≦about 15 at. %, an amount c of antimony (Sb) is in a range of about 20 at. %≦c≦about 25 at. %, and an amount d of tellurium (Te) is in a range of about 40 at. %≦d≦about 55 at. %. The operating voltage may be one of a write voltage, a read voltage, and an erase voltage.

BRIEF DESCRIPTION OF THE DRAWINGS

Example embodiments will be more clearly understood from the following detailed description taken in conjunction with the accompanying drawings.

FIG. 1 is a block diagram of a phase change layer formed of a quaternary compound according to example embodiments;

FIG. 2 is a flowchart of a method of forming the phase change layer according to example embodiments;

FIG. 3 is a graph of a change in the composition ratio of indium (In) to germanium (Ge) (In/Ge) in the phase change layer with respect to the ratio of radio frequency (RF) power applied to a co-sputtering target according to the method of FIG. 2;

FIG. 4 is a graph of a change in the amount of elements Ge, antimony (Sb), and tellurium (Te) included in the phase change layer formed according to the method of FIG. 2 with respect to the amount of In, according to example embodiments;

FIG. 5 is a graphical representation of X-ray diffraction patterns for InGeSbTe layers subjected to rapid thermal annealing (RTA) after being formed using the method of FIG. 2, according to example embodiments;

FIGS. 6-9 are graphical representations of X-ray diffraction patterns of four InGeSbTe layers formed according to the method of FIG. 2 for each RTA temperature, the four InGeSbTe layers having the same composition, however, different elemental composition ratios;

FIG. 10 is a graphical representation of X-ray diffraction patterns for an InGeSbTe layer subjected to an RTA temperature of about 390° C. after being formed using the method of FIG. 2, according to example embodiments;

FIG. 11 is a graphical representation of reflectance versus temperature for InGeSbTe layers having different amounts of indium (In) that are formed according to the method of FIG. 2, according to example embodiments;

FIG. 12 is a graphical representation of signal intensity versus temperature for InGeSbTe layers having different amounts of indium (In) that are formed according to the method of FIG. 2, according to example embodiments;

FIG. 13 is a cross-sectional view of a phase change memory device according to example embodiments; and FIGS. 14 and 15 are cross-sectional views showing modified shapes of a storage node illustrated in the phase change memory device of FIG. 13, according to example embodiments.

Figure 1:
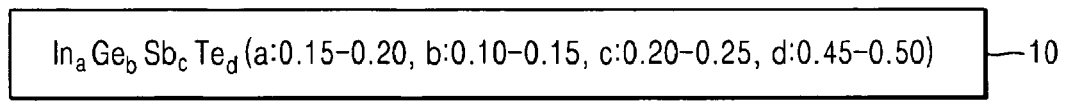
FIGS. 1-15 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. A phase change layer, a method of forming the phase change layer, a phase change memory device including the phase change layer, and methods of manufacturing and operating the phase change memory device according to example embodiments are described with reference to the attached drawings. In the drawings, the thicknesses of layers and regions are exaggerated for clarity. Example embodiments may, however, be embodied in many different forms and should not be construed as being limited to the embodiments set forth herein. Rather, these embodiments are provided so that this disclosure will be thorough and complete, and will fully convey the concept of example embodiments to those skilled in the art. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a phase change layer 10 formed of a quaternary compound, according to example embodiments. Referring to FIG. 1, the phase change layer 10 according to example embodiments may be formed of a quaternary compound, e.g., $In_aGe_bSb_cTe_d$ (IGST). The amount a of indium (In) in the IGST layer may be greater than about 0 and less than or equal to about 0.5 (about $0<a\leq$about 50 at. %), for example, about $0.15\leq a\leq$about 0.2 (about 15 at. %$\leq a\leq$about 20 at. %). The amount b of germanium (Ge) may be greater than about 0 and less than or equal to about 0.25 (about $0<b\leq$about 25 at. %), for example, about $0.1\leq b\leq$about 0.15 (about 10 at. %$\leq b\leq$about 15 at. %).

The amount c of antimony (Sb) may be greater than or equal to about 0.15 and less than or equal to about 0.25 (about 15 at. %$\leq c\leq$about 25 at. %), for example, about $0.2\leq c\leq$about 0.25 (about 20 at. %$\leq c\leq$about 25 at. %). The amount d of tellurium (Te) may be greater than or equal to about 0.3 and less than or equal to about 0.6 (about 30 at. %$\leq d\leq$about 60 at. %), for example, about $0.45\leq d\leq$about 0.5 (about 45 at. %$\leq d\leq$about 50 at. %).

Figure 2:
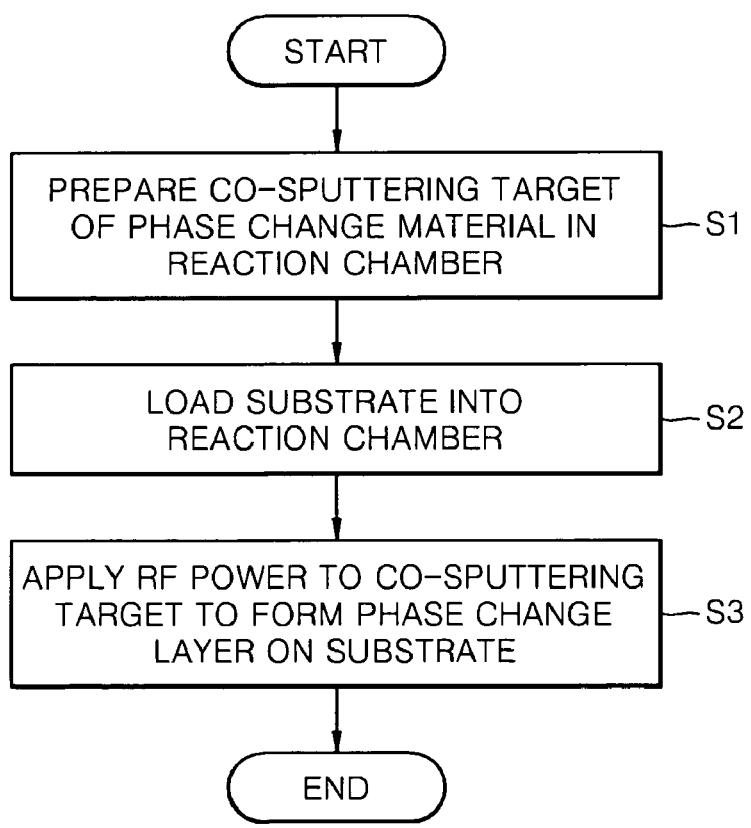

The method of forming the phase change layer 10 will now be described with reference to its flowchart as illustrated in FIG. 2. Referring to FIG. 2, in S1, a co-sputtering target may be prepared within a reaction chamber. In the reaction chamber, a material may be deposited by sputtering. The co-sputtering target may include first and second targets. For example, the first target may be a Ge—Sb—Te based target, e.g., $Ge_2Sb_2Te_5$ (GST). The second target may be made of at least one of In, In—Sb—Te, In—Sb, and In—Te based materials. For example, the In—Sb—Te based material may be $In_3Sb_1Te_2$ (IST). The first and second targets may be located higher than a substrate that is to be loaded into the reaction chamber.

In S2, the substrate, on which the phase change layer 10 will be formed, may be loaded into the reaction chamber including the co-sputtering target. The substrate may be a semiconductor substrate and/or a semiconductor substrate including a film stack formed thereon. The film stack may include a semiconductor element, e.g., a switching element or diode, and an insulating layer. In S3, RF power may be applied to the prepared co-sputtering target in order to form the phase change layer 10 on the substrate that is loaded into the chamber. The phase change layer 10, which is formed in S3, may be the IGST layer. The amount of each element in the IGST layer may be regulated by adjusting the RF power applied to the first and second targets. For example, the amount a of indium (In) may be adjusted to be in a range of about 0.15 to about 0.20 by adjusting the applied RF power.

Figure 3:
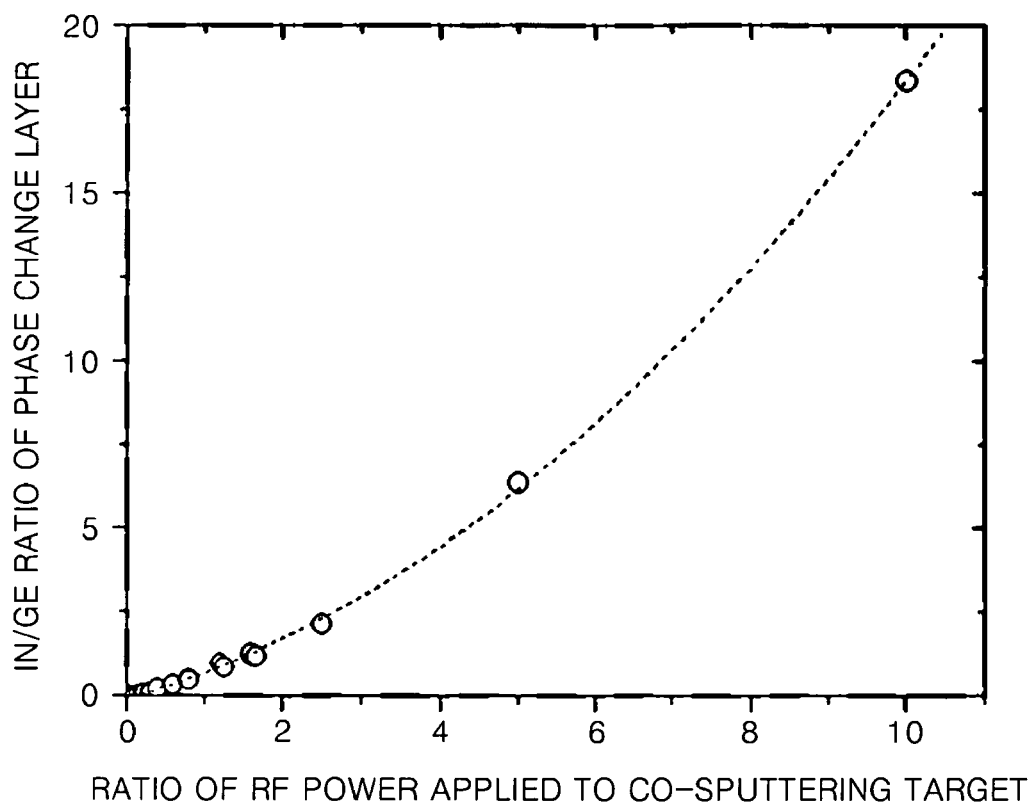

FIG. 3 is a graph illustrating a change in the composition ratio of indium (In) to germanium (Ge) (In/Ge) in the IGST layer with respect to a ratio of RF power applied to the first and second targets according to the method of FIG. 2. Referring to FIG. 3, when first and second RF powers RF1 and RF2 are respectively applied to the first and second targets, the composition ratio of indium (In) to germanium (Ge) may increase as the RF power ratio of the second RF power RF2 to the first RF power RF1 increases. Because a change in the composition ratio of indium (In) to germanium (Ge) is represented by a quadratic function of the RF power ratio of the second RF power RF2 to the first RF power RF1, the composition ratio of indium (In) to germanium (Ge) in the IGST layer by changing the RF power ratio of the second RF power RF2 to the first RF power RF1 may be more easily adjusted.

Figure 4:
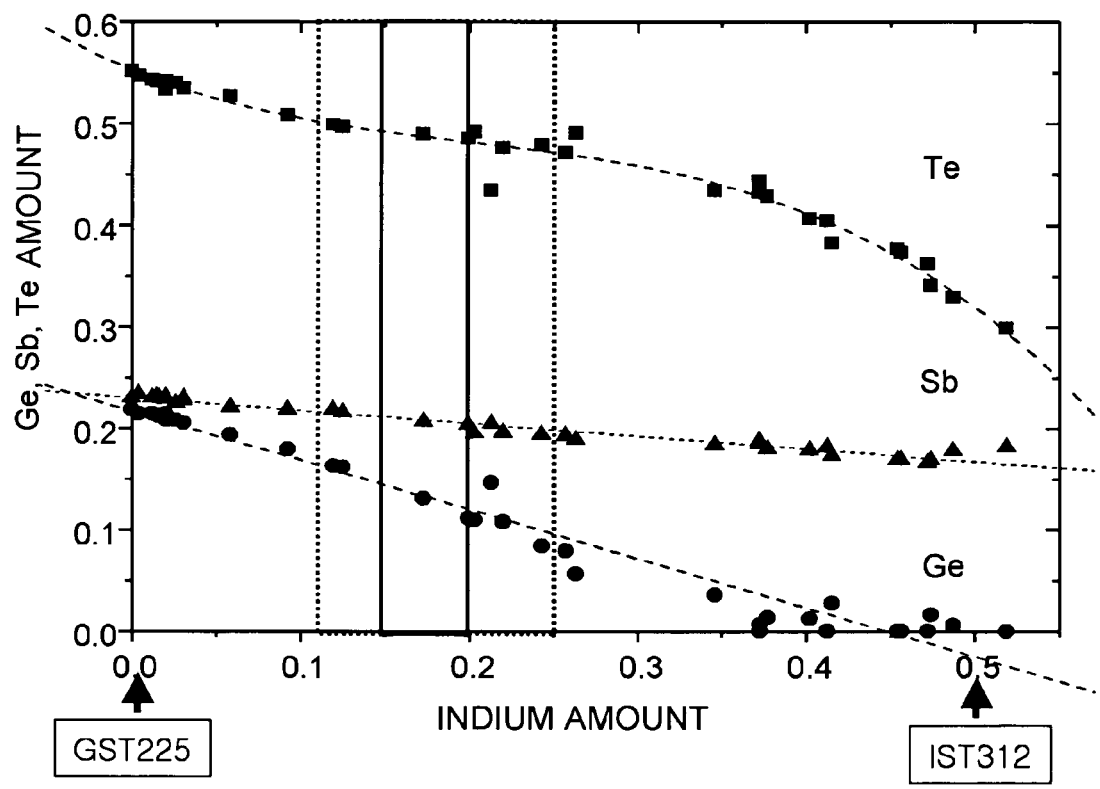

FIG. 4 is a graph illustrating a change in the amount of elements Ge, Sb, and tellurium (Te) included in the IGST layer formed according to the method of FIG. 2 with respect to the amount of indium (In) included therein. Referring to FIG. 4, the amounts of germanium (Ge) and antimony (Sb) may linearly change with respect to the amount of indium (In). The variation of the amount of germanium (Ge) may be greater than the variation of the amount of antimony (Sb) with respect to the amount of indium (In). A change in the amount of tellurium (Te) with respect to the amount of indium (In) may be represented by a cubic function.

As evident from FIGS. 3 and 4, an IGST layer may be more easily formed with a desired composition ratio by adjusting the RF power ratio RF2/RF1. A GST layer and an IST layer may also be formed by adjusting the RF power ratio RF2/RF1. GST, IST and/or IGST layers may be more easily formed by adjusting the RF power ratio of the second RF power RF2 to the first RF power RF1.

The following experiments were conducted to determine how the phase of the IGST layer formed using the method of FIG. 2 changes according to the amount of indium (In) included therein and a temperature at which rapid thermal annealing (RTA) was performed to crystallize the IGST layer.

First through eighth IGST layers were formed using the method of FIG. 2. Each of the first through fourth IGST layers had a composition ratio of indium (In) to germanium (Ge) less than about 1. The amounts of indium (In) included in the first through fourth IGST layers were about 2.0 at. %, about 5.9 at. %, about 9.2 at. %, and about 12.5 at. %, respectively. Each of the fifth through eighth IGST layers had a composition ratio of indium (In) to germanium (Ge) greater than about 1. The amounts of indium (In) included in the fifth through eighth IGST layers were about 17.3 at. %, about 25.7 at. %, about 34.6 at. %, and about 37.7 at. %, respectively. After the formation of the first through eighth IGST layers, the first through eighth IGST layers were subjected to RTA for crystallization at about 280° C. for about 5 minutes. The first and second GST layers were formed for comparison with the first through eighth IGST layers. The first and second GST layers were respectively subjected to RTA at about 280° C. and about 250° C. for about 5 minutes in a nitrogen atmosphere. The first through eighth IGST layers and the first and second GST layers were all deposited at about room temperature.

Figure 5:
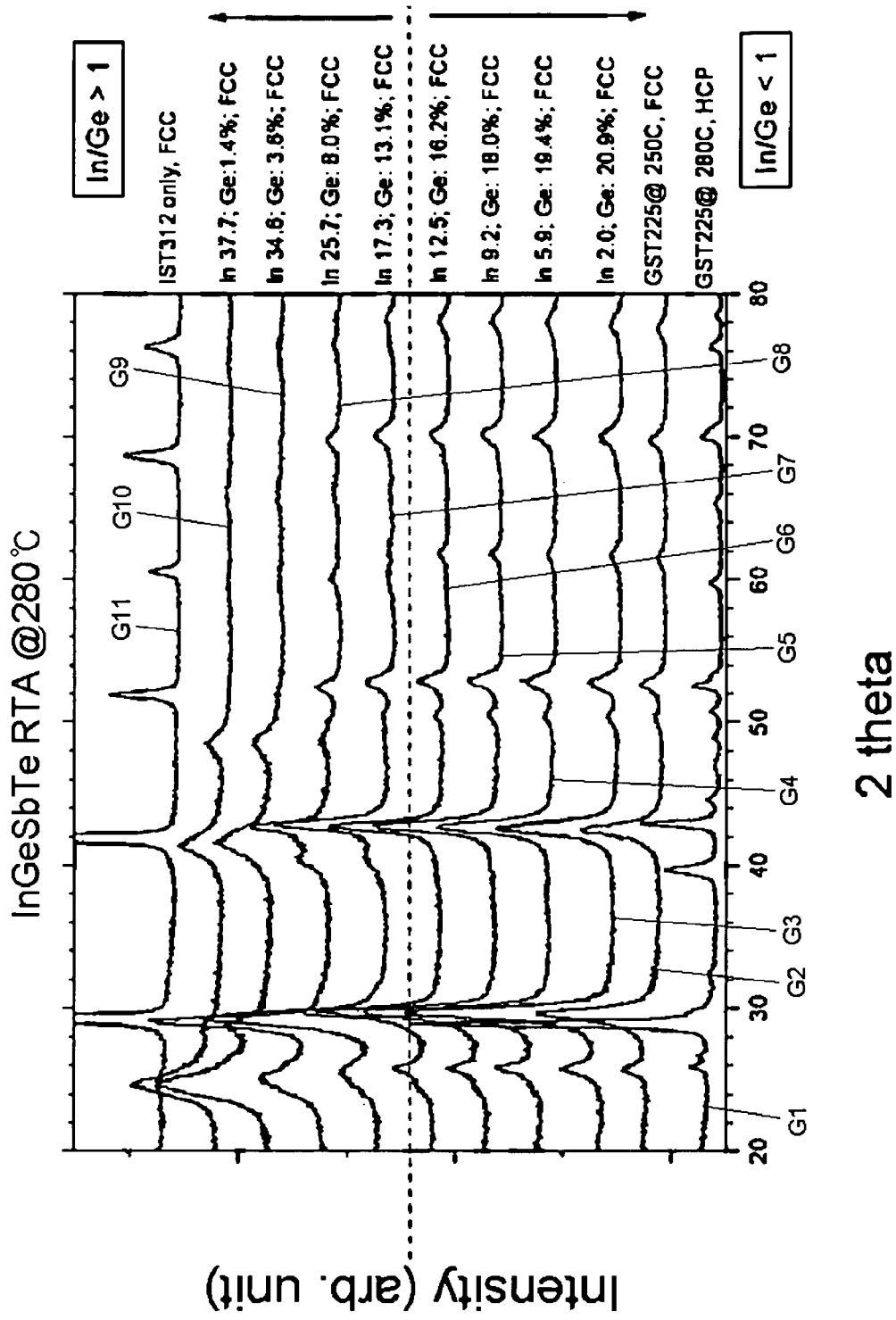

FIG. 5 is a graphical representation of X-ray diffraction patterns for the first through eighth IGST layers and the first and second GST layers subjected to RTA. The graphs G1 and G2 in FIG. 5 illustrate X-ray diffraction patterns for the first and second GST layers. The graphs G3-G10 illustrate X-ray diffraction patterns for the first through eighth IGST layers. The graph G11 illustrates an X-ray diffraction pattern for an IST layer having a face-centered cubic (FCC) crystal structure. The graph G1 in FIG. 5 illustrates that the first GST layer subjected to RTA at about 280° C. has a Hexagonal Close-Packed (HCP) structure. The graph G2 illustrates that the second GST layer subjected to RTA at about 250° C. has a Face Centered Cubic (FCC) crystal structure.

By comparing the graphs G3-G10 with the graphs G1 and G2, the first through eighth IGST layers formed using the method of FIG. 2 may all have an FCC structure. As evident from FIG. 5, the IGST layers subjected to RTA for crystallization at about 280° C. after being formed using the method of FIG. 2 may all remain in a single phase. Another phase was not observed in the IGST layers despite an increase in the amount of indium (In). Additionally, neither delamination nor agglomeration was observed in the IGST layer. The graphs G6 through G10 illustrate that increasing the amount of indium (In) within the IGST layers may cause the peaks of X-ray diffraction patterns to shift to the left and widen due to the fact that a stress or strain is generated within the IGST layers as indium (In) atoms with a relatively large radius are located at the positions of germanium (Ge) atoms with a relatively small radius.

An experiment was conducted to verify the structural stability of IGST layers subjected to RTA. For example, ninth through twelfth IGST layers were formed using the method of FIG. 2. The amounts of indium (In) and germanium (Ge) in the ninth through twelfth IGST layers were about 12.5 at. % and about 16.2 at. %, about 17.3 at. % and about 13.1 at. %, about 19.9 at. % and about 11.2 at. %, about 25.7 at. % and about 8.0 at. %, respectively. RTA processes were performed on the ninth through twelfth IGST layers in a nitrogen atmosphere at about 250° C., about 280° C., about 300° C., and about 320° C. for about 5 minutes.

Figure 6:
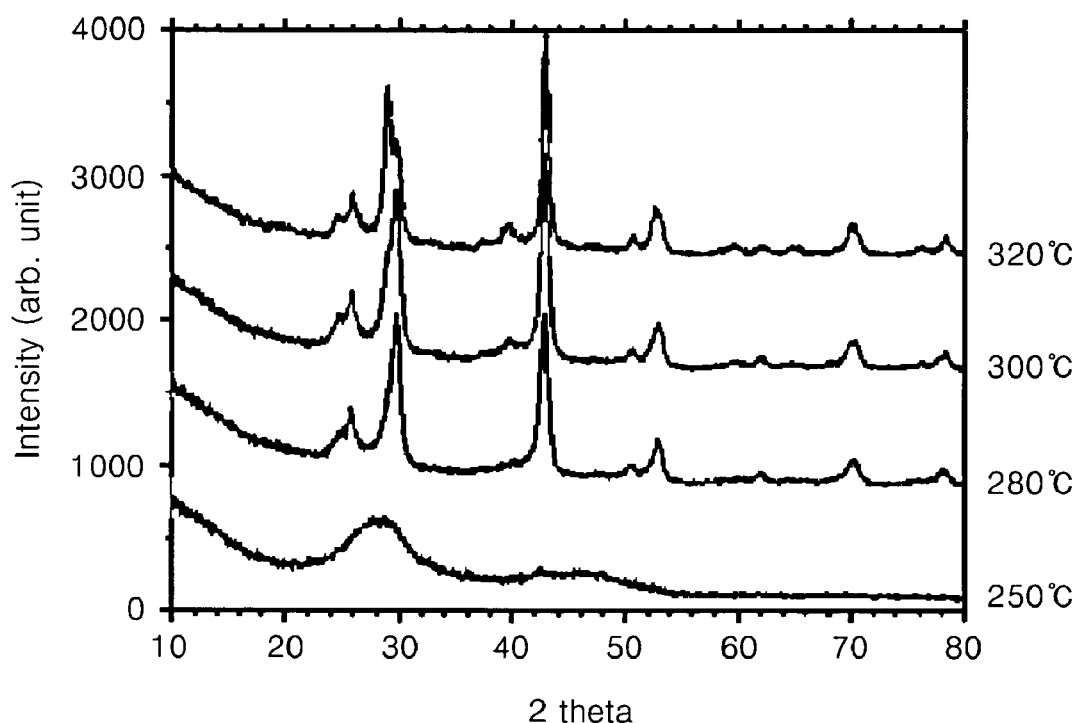
Figure 7:
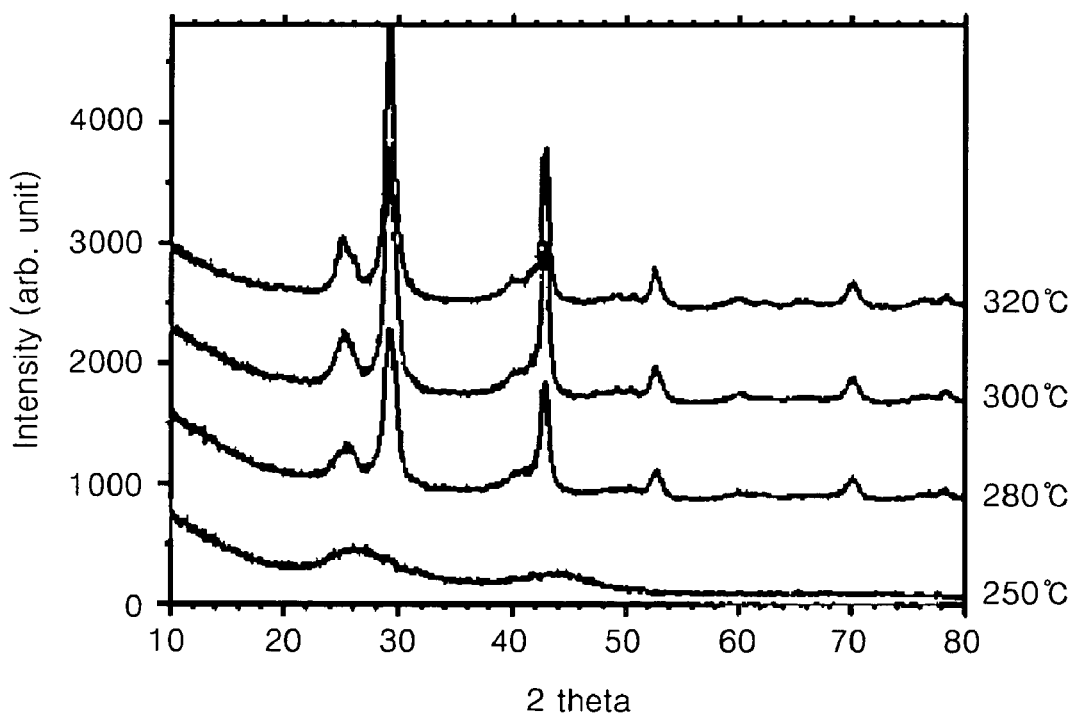
Figure 8:
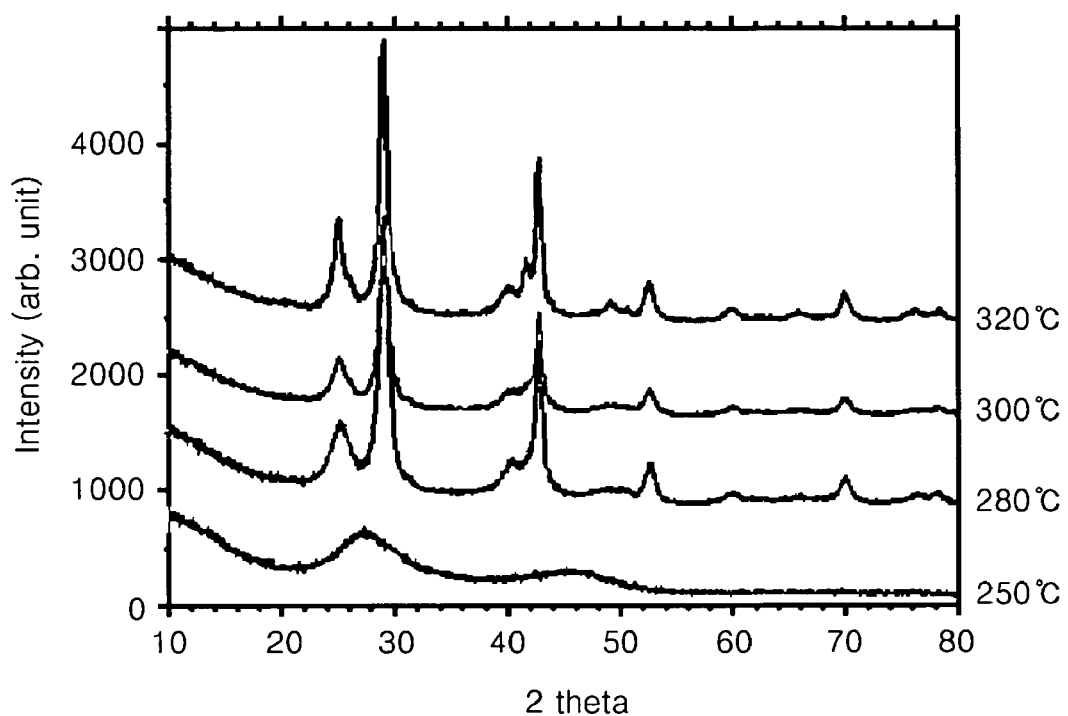
Figure 9:
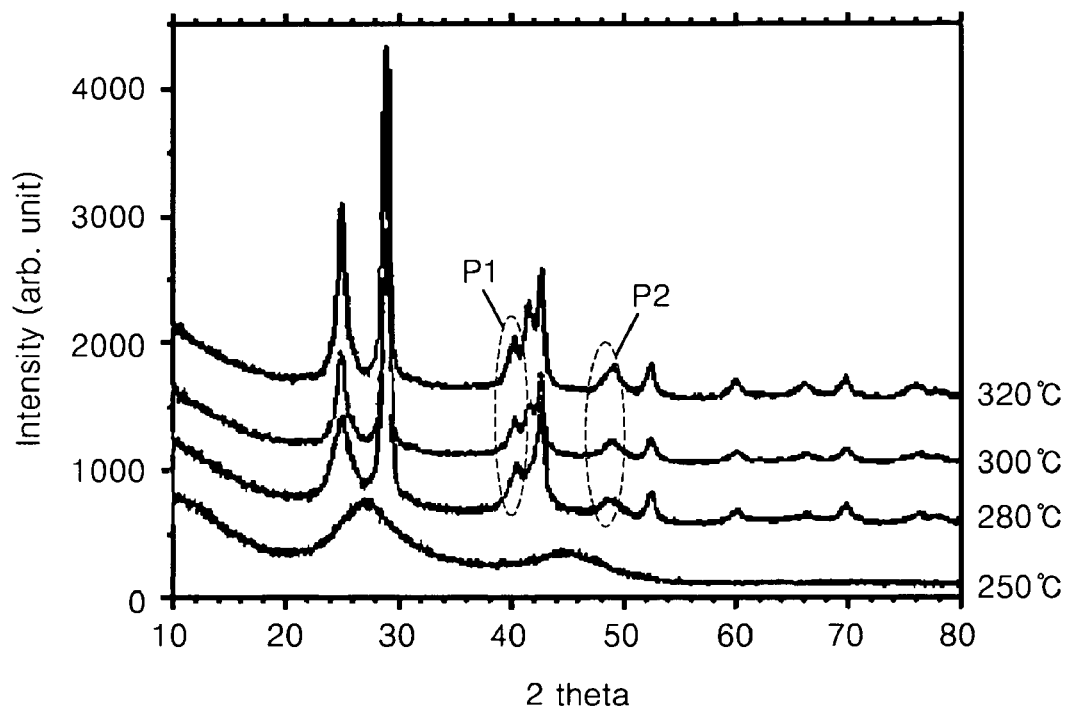

FIGS. 6-9 are graphs respectively of X-ray diffraction patterns of the ninth through twelfth IGST layers. Referring to FIGS. 6-9, the ninth through twelfth IGST layers may be in an amorphous state when the RTA temperature is about 250° C. However, when the RTA temperature is about 280° C., about 300° C., or about 320° C., the ninth through twelfth IGST layers may all have a crystal structure. FIGS. 6-8 illustrate that the ninth through eleventh IGST layers (including a lesser amount of indium (In) than the twelfth IGST layer) may have a single-phase FCC structure when the RTA temperature is about 280° C., about 300° C., and about 320° C. On the other hand, FIG. 9 illustrates the twelfth IGST layer including a greater amount of indium (In) than the remaining IGST layers and has peaks P1 and P2 that are not observed in the remaining IGST layers at a diffraction angle 2θ of about 420 and about 480. The presence of the new peaks P1 and P2 may be due to a creation of other compounds, e.g., $In_xSb_y$, and $In_xTe_y$, within the twelfth IGST layer caused by an increase in amount of indium (In).

As is evident from FIGS. 6-9, the IGST layers may maintain a single phase until the amount of indium (In) reaches about 20 at. %. An experiment was conducted to verify the structural stability of an IGST layer subjected to RTA at a temperature higher than about 320° C. For example, thirteenth through seventeenth IGST layers were formed using the method of FIG. 2 and a third GST layer was formed for comparison. The amounts of indium (In) in the thirteenth through seventeenth IGST layers were about 12.5 at. %, about 17.3 at. %, about 25.7 at. %, about 34.6 at. %, and about 37.7 at. %, respectively. After the formation of the thirteenth through seventeenth IGST layers and the third GST layer, the thirteenth through seventeenth IGST layers and the third GST layer were subjected to RTA in a nitrogen atmosphere at about 390° C. for about 5 minutes.

Figure 10:
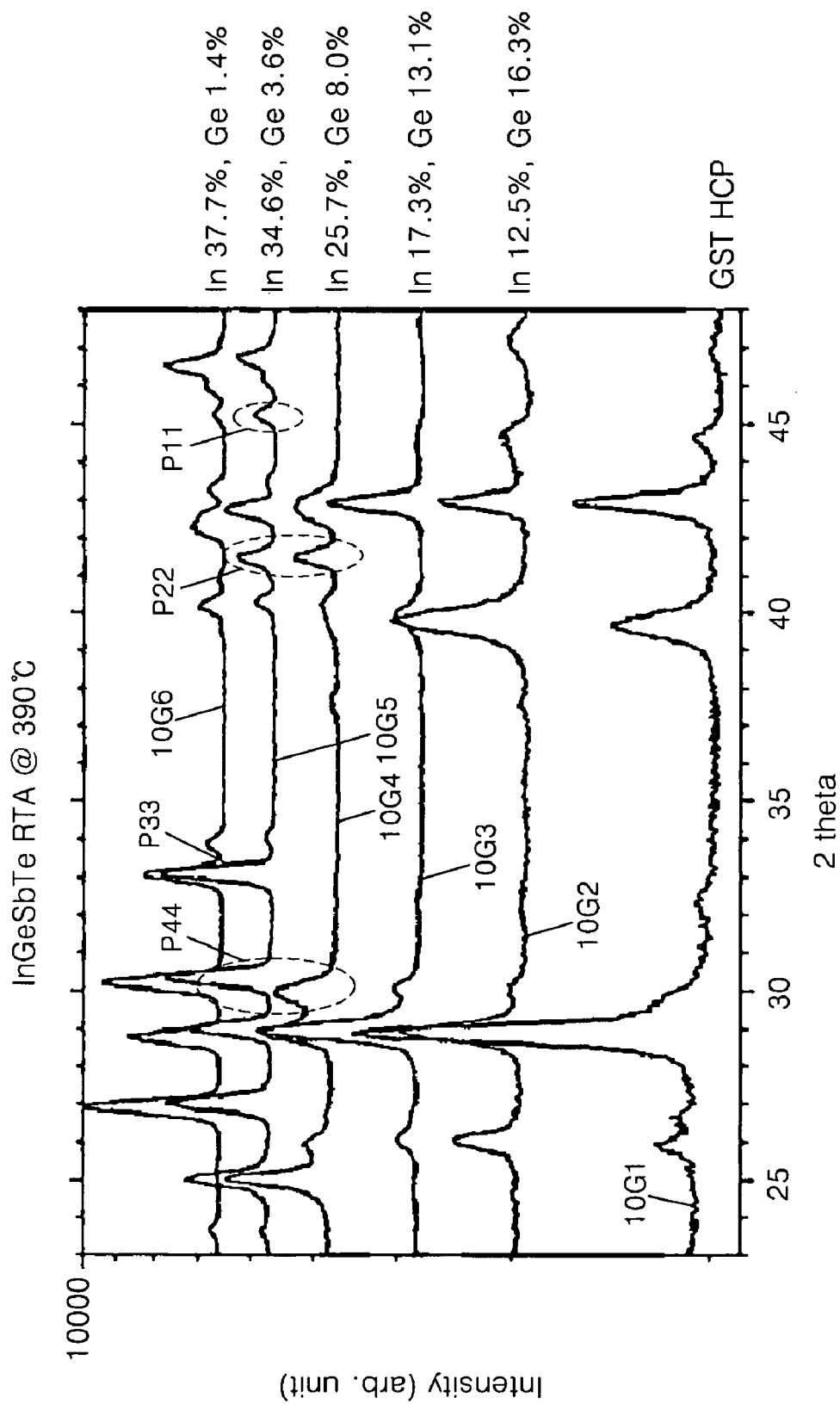

FIG. 10 is a graphical representation of an X-ray diffraction pattern for the thirteenth through seventeenth IGST layers and the third GST layer. The graph 10G1 in FIG. 10 illustrates that the third GST layer has an HCP crystal structure. The graphs 10G2 and 10G3 illustrate that the thirteenth and fourteenth IGST layers including an amount of indium (In) less than about 25 at. % have a single-phase HCP structure. However, the graphs 10G4 and 10G5 illustrate that X-ray diffraction patterns of the fifteenth and sixteenth IGST layers including the amount of indium (In) of more than about 25 at. % have new peaks P11 through P44. The appearance of the new peaks P11 through P44 may be due to a creation of compounds, e.g., $In_xSb_y$ and $In_xTe_y$, other than IGST within the fifteenth and sixteenth IGST layers. The graph 10G6 illustrates that delamination and agglomeration occur in the seventeenth IGST layer including the amount of indium (In) of more than about 35 at. %.

Referring to FIGS. 5-10, the result of the analysis of the structural stability of IGST layers formed according to example embodiments illustrate that the IGST layers may exhibit improved thermal and structural stability when the amount of indium (In) is greater than about 0 and less than or equal to about 25 at. % because the IGST layers may maintain a single phase.

After conducting the aforementioned experiments, the reflectance of a GST layer, an IST layer, and a plurality of IGST layers with different amounts of indium (In) formed according to example embodiments were measured to check the crystallization temperature $T_C$ of the aforementioned layers. The measurement was made on each IGST layer over a range of temperatures between about 100° C. and about 400° C.

Figure 11:
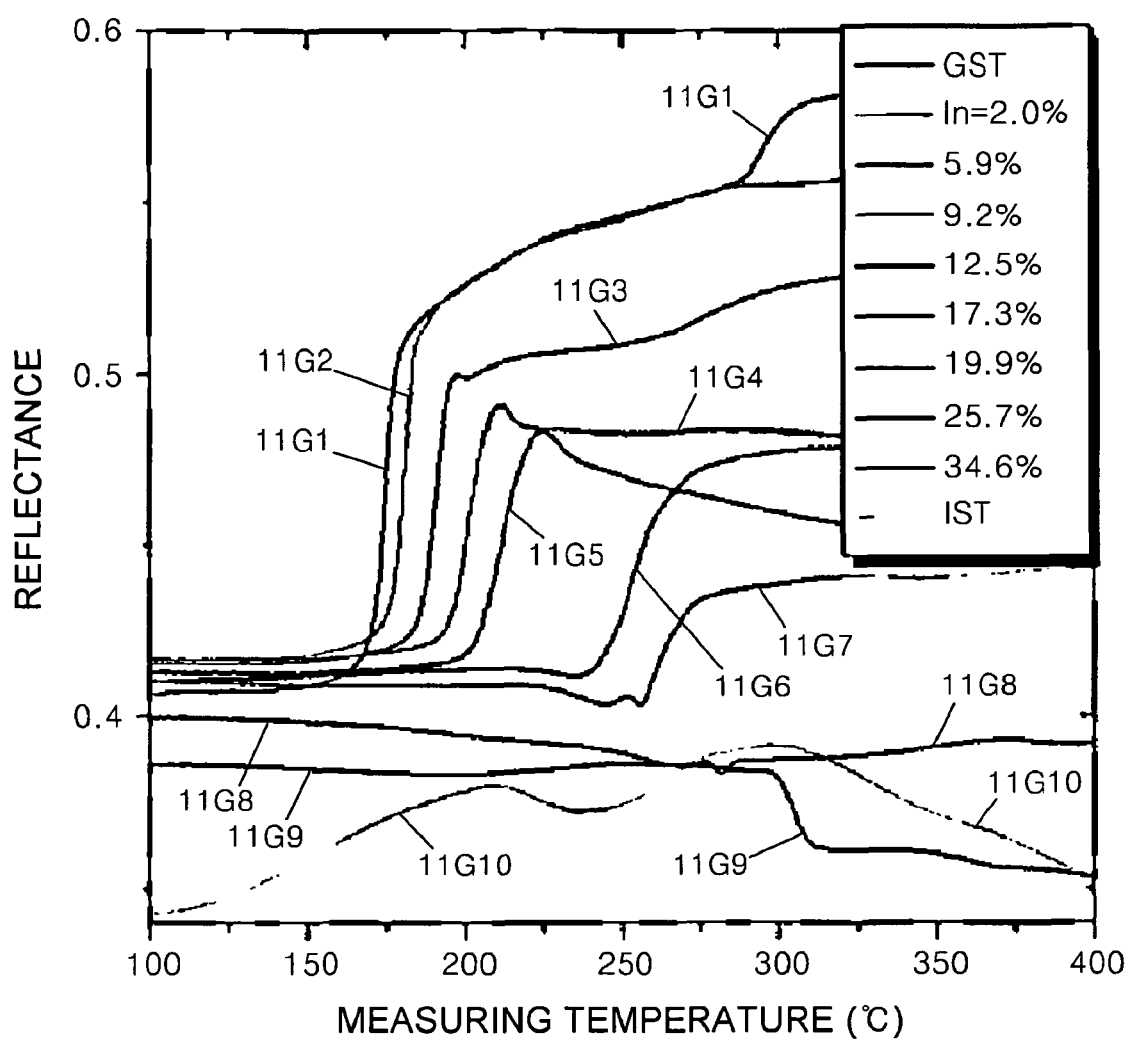

FIG. 11 is a graphical representation of reflectance versus temperature for the GST layer, the IST layer, and the IGST layers, according to example embodiments. The graphs 11G1 and, 11G10 in FIG. 11 illustrate reflectance measured on the GST layer and the IST layer. The graphs 11G2-11G9 illustrate reflectance measured on the 18th-25th IGST layers respectively including about 2.0 at. %, about 5.9 at. %, about 9.2 at. %, about 12.5 at. %, about 17.3 at. %, about 19.9 at. %, about 25.7 at. %, and about 34.6 at. % of indium (In). Portions of the graphs 11G1-11G10, in which the reflectance sharply increases, indicate the crystallization temperatures $T_C$ of the phase change layers. For example, in graph 11G1, the crystallization temperature $T_C$ of the GST layer may be about 160° C. at which the reflectance sharply increases.

The graphs 11G2-11G9 illustrate that the crystallization temperature $T_C$ of the IGST layers may become higher than that of the GST layer as the amount of indium (In) included therein increases. For example, as illustrated in graphs 11G2 through 11G7, a clear distinction may exist between amorphous and crystalline states and a crystallization temperature $T_C$ may be increased for the thermally and structurally stable IGST layers including the amount a of indium (In) ranging from about 0 to about 25 at. % (about 0<a≦about 25 at. %). For example, the graph 11G7 illustrates that the crystallization temperature of the IGST layer including about 19.9 at. % of indium (In) may be above about 250° C., for example, about 56% (about 90° C.) higher than the crystallization temperature (about 160° C.) of a conventional GST layer.

After measuring the reflectance of phase change layers as described above, a signal intensity was measured using an ellipsometer for an IST layer and a plurality of IGST layers formed according to example embodiments to observe a change in melting points of the IGST layers with respect to the amount of indium (In). The measurement was made on the selected IGST layer over a range of temperatures from about 500° C. to about 650° C.

Figure 12:
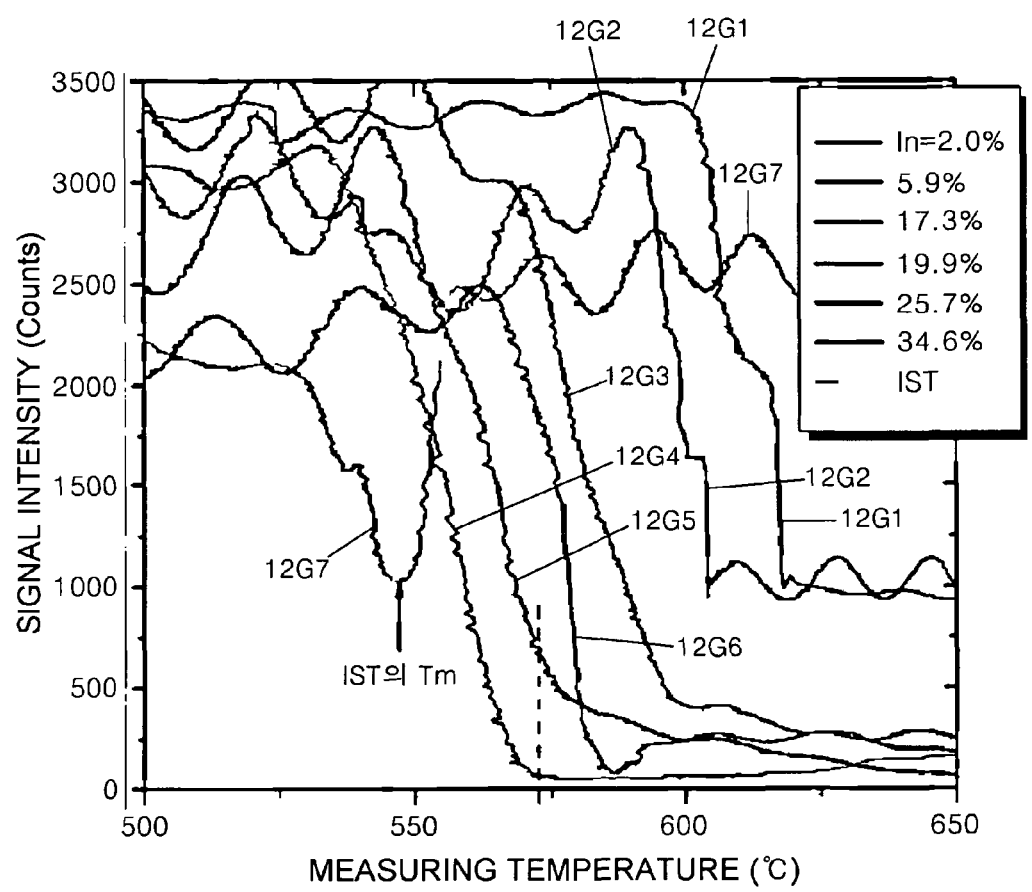

FIG. 12 is a graphical representation of signal intensity versus measuring temperature for the IST layer and the IGST layers, according to example embodiments. The graph 12G7 illustrates a signal intensity measured for the IST layer. Graphs 12G1-12G6 illustrate signal intensities measured for the IGST layers respectively including about 2.0 at. %, about 5.9 at. %, about 17.3 at. %, about 19.9 at. %, about 25.7 at. %, and about 34.6 at. % of In. Portions of the graphs 12G1-12G6, in which the signal intensity sharply decreases, may indicate the melting points Tm of the phase change layers. For example, in graph 12G7, the melting point Tm of the IST layer may be about 540° C. at which the signal intensity sharply decreases.

The graphs 12G1-12G6 illustrate that the melting points of the IGST layers decrease as the amount of indium (In) included therein increases. For example, the IGST layer including about 19.9 at. % of indium (In) as shown in the graph 12G4 may have a melting point of about 570° C. that is about 8% (about 50° C.) lower than the melting point (about 620° C.) of a conventional GST layer. As illustrated in the graphs 12G5 and 12G6, the IGST layers including about 25.7 at. % and about 34.6 at. % of indium (In) respectively have melting points between about 570° C. and about 600° C.

Figure 13:
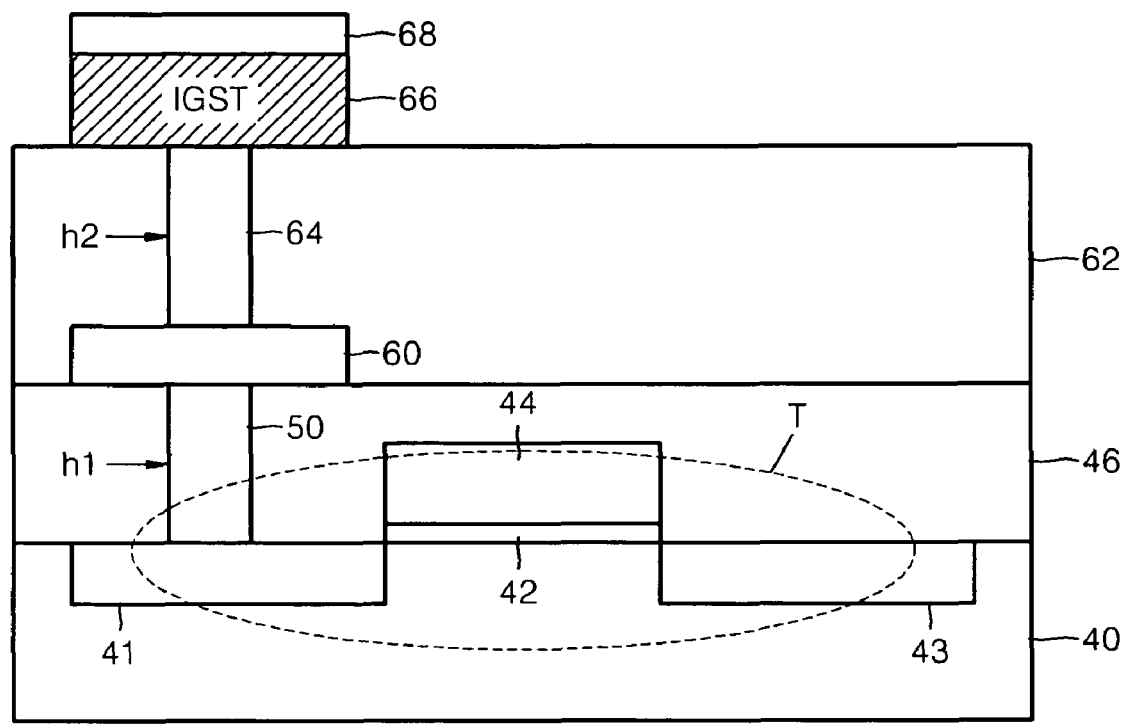

FIG. 13 is a cross-sectional view of a phase change memory device including a phase change layer formed using the method according to example embodiments. Referring to FIG. 13, first and second impurity regions 41 and 43 may be formed in a substrate 40, and spaced a given distance apart from each other. For example, the first and second impurity regions 41 and 43 may be doped with n-type impurities. The substrate 40 may be doped with impurities having a conductivity type opposite to the conductivity type of the first and second impurity regions 41 and 43. For example, the substrate 40 may be a p-type silicon substrate. The first and second impurity regions 41 and 43 may have different shapes. One of the first and second impurity regions may be a source region, and the other one may be a drain region. A gate oxide layer 42 and a gate electrode 44 may be sequentially formed on the substrate 40 between the first and second impurity regions 41 and 43. The substrate 40, the first and second impurity regions 41 and 43, and the gate electrode 44 may constitute a field effect transistor or switching element (hereinafter referred to as a 'transistor T').

A first insulating interlayer 46 may be formed on the substrate 40 to cover the transistor T. A contact hole h1 may be formed through the first insulating interlayer 46 so as to expose the first impurity region 41. Alternatively, the contact hole h1 may be formed in the first insulating interlayer 46 so as to expose the second impurity region 43 instead of the first impurity region 41. The contact hole h1 may be filled with a conductive plug 50. A lower electrode 60 may be formed on the first insulating interlayer 46 to cover an exposed upper surface of the conductive plug 50. The lower electrode 60 may also function as a pad, and may be, for example, a TiN electrode and/or a TiAlN electrode. However, the lower electrode 60 may be formed of a material other than the aforementioned materials. A second insulating interlayer 62 may be formed on the first insulating interlayer 46 so as to cover the lower electrode 60. The second insulating interlayer 62 may be formed of substantially the same insulating material as that of the first insulating interlayer 46. A via hole h2 may be formed through the second insulating interlayer 62 so as to expose an upper surface of the lower electrode 60. The via hole h2 may be filled with a lower electrode contact layer 64. The lower electrode contact layer 64 may be formed of substantially the same material as the lower electrode 60. A phase change layer 66 may be formed on the second insulating interlayer 62 so as to cover the exposed upper surface of the lower electrode contact layer 64. The phase change layer 66 may be formed of a quaternary compound, e.g., IGST. If the phase change layer 66 is formed of IGST, the amount a of indium (In) in the IGST layer may be greater than about 0 and less than or equal to about 50 at. % (about 0<a≦about 50 at. %), for example, about 15 at. %≦a≦about 20 at. %. The amount b of germanium (Ge) may be greater than about 0 and less than or equal to about 25 at. % (about 0<b≦about 25 at. %), for example, about 10 at. %≦b≦about 15 at. %. The amount c of antimony (Sb) may be greater than or equal to about 15 at. % and less than or equal to about 25 at. % (about 15 at. %≦c≦about 25 at. %), for example, about 20 at. %≦c≦about 25 at. %. The amount d of tellurium (Te) may be greater than or equal to about 30 at. % and less than or equal to about 60 at. % (about 30 at. %≦d≦about 60 at. %), for example, about 45 at. %≦d≦about 50 at. %.

An upper electrode 68 may be disposed on the phase change layer 66. The upper electrode 68, the phase change layer 66, and the lower electrode contact layer 64 may form a storage node. The storage node may have other various shapes than the shape illustrated in FIG. 13. For example, the storage node may have a shape as illustrated in FIG. 14.

Figure 14:
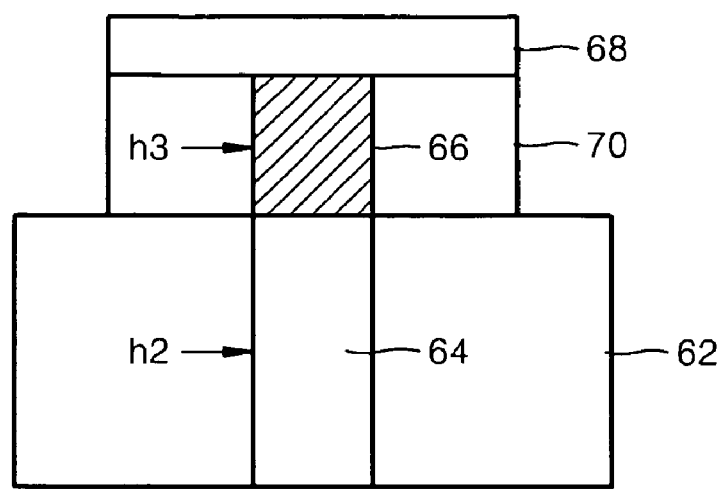
Figure 15:
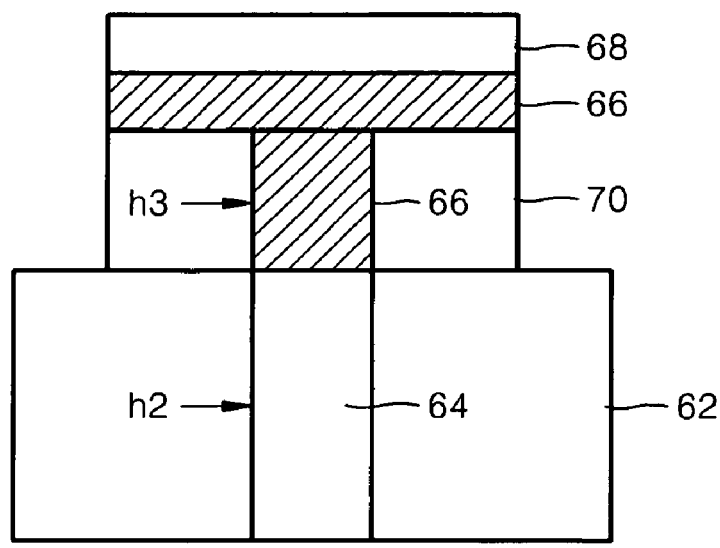

FIGS. 14 and 15 are cross-sectional views showing modified shapes of the storage node illustrated in FIG. 13, according to example embodiments. Referring to FIG. 14, an upper insulating layer 70 including a third contact hole h3 that exposes the lower electrode contact layer 64 may be formed on the second insulating interlayer 62. The third contact hole h3 may be filled with the phase change layer 66. The upper electrode 68 may be disposed on the upper insulating layer 70 so as to cover the phase change layer 66. The storage node may have a shape as illustrated in FIG. 15. In the storage node shown in FIG. 15, the third contact hole h3 may be filled with the phase change layer 66, and also the phase change layer 66 may be formed on the upper insulating layer 70 around the third contact hole h3. The lower electrode contact layer 64 may also be a phase change layer. The phase change memory device may further include an adhesion layer (not shown) and/or a diffusion prevention layer (not shown) between the upper electrode 68 and the phase change layer 66.

A method of manufacturing the phase change memory device of FIG. 13 will now be described with reference to FIG. 13. Referring to FIG. 13, a conventional method may be performed up to the operation of filling the second contact hole h2 with the lower electrode contact layer 64. Thereafter, the phase change layer 66 may be formed on the second insulating interlayer 62 so as to cover the lower electrode contact layer 64. The phase change layer 66 may be formed of a quaternary compound, e.g., IGST. The IGST phase change layer 66 may be formed on the resulting substrate structure including the lower electrode contact layer 64 according to the method of FIG. 2.

The upper electrode 68 may then be formed on the phase change layer 66. The adhesion layer and/or the diffusion prevention layer may be formed between the upper electrode 68 and the phase change layer 66. The phase change layer 66 may be formed to fill the third contact hole h3 with the upper insulating layer 70 as illustrated in FIG. 14. Alternatively, the phase change layer 66 may be formed on the upper insulating layer 70 so as to cover the phase change layer 66 filling the third contact hole h3 as illustrated in FIG. 15.

A method of operating the phase change memory device according to example embodiments will now be described with reference to FIG. 13. Referring to FIG. 13, the transistor T may be maintained in an ON state, and then, a given operating voltage may then be applied between the upper electrode 68 and the second impurity region 43. The operating voltage may be a write voltage for writing data onto the phase change layer 66, and thus, may cause a reset current to be applied to the phase change layer 66. If an amorphous region is formed in the phase change layer 66 by the application of the reset current, a data value of "1" may be recorded on the phase change layer and the reset current may be less than about 1 mA.

The operating voltage may be a read voltage for reading data recorded on the phase change layer 66. If the operating voltage is the read voltage, the resistance of the phase change layer 66 may be measured and compared with a reference resistance. If the measured resistance is lower than the reference resistance, the phase change layer 66 may be in a crystalline state and data value of "0" may be read from the phase change layer 66. Conversely, if the measured resistance is higher than the reference resistance, the phase change layer 66 may be in an amorphous state and a data value of "1" may be read from the phase change layer 66. The operating voltage may be an erase voltage to erase data recorded in the phase change layer 66, and thus, may cause a set current to be applied to the phase change layer 66. Upon an application of the set current to the phase change layer 66, an amorphous region of the phase change layer 66 may be changed to a crystalline region so that the entire phase change layer 66 may remain in a crystalline state.

While example embodiments have been particularly shown and described with reference to example embodiments thereof, example embodiments should be considered in descriptive sense only and not for purposes of limitation. For example, it will be understood by one of ordinary skill in the art that elements other than those of the IGST phase change layer of example embodiments may be used. For example, a PN junction diode may be used instead of the transistor T. It will be understood by one of ordinary skill in the art that various changes in form and details may be made therein without departing from the spirit and scope as defined by the following claims.

As described above, a storage node in a phase change memory device may include an IGST layer including about 15 to about 20 at. % of indium (In) as a phase change layer. The phase change layer, which is formed of IGST, may exhibit improved thermal and structural stability and may have a higher crystallization temperature and lower melting point than a GST layer. Thus, example embodiments may reduce a reset current of a PRAM and may increase its integration density. Example embodiments may also increase the crystallization temperature, and thus, prevent or reduce a disturbance between unit cells and a degradation of retention or IR reflow characteristics.

While example embodiments have been particularly shown and described with reference to exemplary embodiments thereof, it will be understood by one of ordinary skill in the art that various changes in form and details may be made therein without departing from the spirit and scope as defined by the following claims and their equivalents.

What is claimed is:

1. A phase change layer comprising a quaternary compound including an amount a of indium (In) in a range of about 15 at. % about 20 at. %, wherein the quaternary compound is $In_aGe_bSb_cTe_d$ (IGST), and wherein an amount b of germanium (Ge) is in a range of about 10 at. % about 15 at. %, an amount c of antimony (Sb) is in a range of about 20 at. % c about 25 at. %, and an amount d of tellurium (Te) is in a range of about 40 at. % d about 55 at. %.

2. A phase change memory device comprising:
a storage node including the phase change layer of claim 1; and
a switching element connected to the storage node.

3. A method of operating the phase change memory device of claim 2 comprising:
maintaining the switching element in an ON state; and
applying an operating voltage to the storage node.

4. The method of claim 3, wherein the quaternary compound is $In_aGe_bSb_cTe_d$ (IGST), and wherein an amount b of germanium (Ge) is in a range of about 10 at. %≦b≦about 15 at. %, an amount c of antimony (Sb) is in a range of about 20 at. %≦c≦about 25 at. %, and an amount d of tellurium (Te) is in a range of about 40 at. %≦d≦about 55 at. %.

5. The method of claim 3, wherein the operating voltage is one of a write voltage, a read voltage, and an erase voltage.

* * * * *